(12) United States Patent
Hihath et al.

(10) Patent No.: US 11,943,940 B2
(45) Date of Patent: Mar. 26, 2024

(54) NUCLEIC ACID-BASED ELECTRICALLY READABLE, READ-ONLY MEMORY

(71) Applicants: The Regents of the University of California, Oakland, CA (US); University of Washington, Seattle, WA (US); Emory University, Atlanta, GA (US)

(72) Inventors: Joshua Hihath, Davis, CA (US); Manjeri P. Anantram, Seattle, WA (US); Yonggang Ke, Atlanta, GA (US)

(73) Assignees: The Regents of the University of California, Oakland, CA (US); University of Washington, Seattle, WA (US); Emory University, Atlanta, GA (US)

( * ) Notice: Subject to any disclaimer, the term of this patent is extended or adjusted under 35 U.S.C. 154(b) by 640 days.

(21) Appl. No.: 17/253,088

(22) PCT Filed: Jul. 11, 2019

(86) PCT No.: PCT/US2019/041396
§ 371 (c)(1),
(2) Date: Dec. 16, 2020

(87) PCT Pub. No.: WO2020/014478
PCT Pub. Date: Jan. 16, 2020

(65) Prior Publication Data
US 2022/0005870 A1    Jan. 6, 2022

Related U.S. Application Data

(60) Provisional application No. 62/696,734, filed on Jul. 11, 2018.

(51) Int. Cl.
*H01L 27/28*    (2006.01)
*H10K 10/50*    (2023.01)
(Continued)

(52) U.S. Cl.
CPC .......... *H10K 19/202* (2023.02); *H10K 10/50* (2023.02); *H10K 85/761* (2023.02)

(58) Field of Classification Search
CPC .... H10K 19/202; H10K 10/50; H10K 85/761; H10K 10/701; B82Y 10/00; B82Y 15/00;
(Continued)

(56) References Cited

U.S. PATENT DOCUMENTS

| | | |
|---|---|---|
| 2007/0117109 A1 | 5/2007 | Rothemund |
| 2010/0155698 A1 | 6/2010 | Lieber et al. |

(Continued)

FOREIGN PATENT DOCUMENTS

WO    2004061859 A2    7/2004

OTHER PUBLICATIONS

European Search Report for EP Application No. 19834081.2 dated Feb. 23, 2022, 9 pages.

*Primary Examiner* — Ermias T Woldegeorgis
(74) *Attorney, Agent, or Firm* — Mueting Raasch Group

(57) ABSTRACT

A nanostructured cross-wire memory architecture is provided that can interface with conventional semiconductor technologies and be electrically accessed and read. The architecture links lower and upper sets of generally parallel nanowires oriented crosswise, with a memory element that has a characteristic conductance. Each nanowire end is attached to an electrode. Conductance of the linkages in the gap between the wires encodes the information. The nanowires may be highly-conductive, self-assembled, nucleic acid-based nanowires enhanced with dopants including metal ions, carbon, metal nanoparticles and intercalators. Conductance of the memory elements can be controlled by sequence, length, conformation, doping, and number of pathways between nanowires. A diode can also be connected in series with each of the memory elements. Linkers may (Continued)

also be redox or electroactive switching molecules or nanoparticles where the charge state changes the resistance of the memory element.

29 Claims, 5 Drawing Sheets

Specification includes a Sequence Listing.

(51) Int. Cl.
*H10K 19/00* (2023.01)
*H10K 85/00* (2023.01)

(58) Field of Classification Search
CPC ..... G11C 11/5664; G11C 17/14; G11C 17/10; G11C 2213/72; G11C 2213/77; G11C 2213/81; G11C 13/003; G11C 13/0019; G11C 11/54; H01L 29/0673
See application file for complete search history.

(56) References Cited

U.S. PATENT DOCUMENTS

| | | | | |
|---|---|---|---|---|
| 2010/0314600 | A1* | 12/2010 | Lee | H01L 27/10 977/762 |
| 2011/0001117 | A1* | 1/2011 | Lieber | H01L 29/1602 977/762 |
| 2014/0079592 | A1* | 3/2014 | Chang | G01N 27/3278 422/69 |

* cited by examiner

SEQUENCE LISTING

<160> NUMBER OF SEQ ID NOS: 2

<210> SEQ ID NO 1
<211> LENGTH: 15
<212> TYPE: DNA
<213> ORGANISM: artificial
<220> FEATURE:

```
<223> OTHER INFORMATION: Synthetic sequences

<400> SEQUENCE: 1
cccttttttt ttccc                                                    15

<210> SEQ ID NO 2
<211> LENGTH: 13
<212> TYPE: DNA
<213> ORGANISM: artificial
<220> FEATURE:
<223> OTHER INFORMATION: Synthetic sequences

<400> SEQUENCE: 2 gggggtttt ttt                                                       13
```

NUCLEIC ACID-BASED ELECTRICALLY READABLE, READ-ONLY MEMORY

CROSS-REFERENCE TO RELATED APPLICATIONS

This application claims priority to, and the benefit of, U.S. provisional patent application Ser. No. 62/696,734 filed on Jul. 11, 2018, incorporated herein by reference in its entirety.
cl SEQUENCE LISTING
This application contains a Sequence Listing electronically submitted via EFS-Web to the United States Patent and Trademark Office as an ASCII text file entitled "0652000003US01 SequenceListing ST25.txt" having a size of 4 kilobytes and created on Apr. 22, 2021. The information contained in the Sequence Listing is incorporated by reference herein.

STATEMENT REGARDING FEDERALLY SPONSORED RESEARCH OR DEVELOPMENT

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND

1. Technical Field

The technology of this disclosure pertains generally to devices and systems for electronic data storage and retrieval, and more particularly to nucleic acid based, Read-Only-Memory (e.g. DNA-ROM) devices where information can be directly accessed electrically and interfaced with conventional semiconductor technologies.

2. Background Discussion

Memory in conventional computing devices has historically been physically separated from the data processing engine. As processor speeds have increased over time, there has been a pressing need for larger memories and faster access. For decades, the goal of engineers has been to develop a universal memory technology that was low in cost, reliable, high density, and non-volatile. Ideally, this technology could be quickly written, read or erased, and would last indefinitely in any defined state. Fundamentally, these characteristics require a technology that uses low-energies to set its state as well as be stable enough that thermal energy from the environment will not modify that state. Generally, these two requirements are contradictory, as decreasing the writing energy typically decreases the thermal barrier to relaxation. It is this dichotomy that has led to decades of trying to delicately balance performance and stability, resulting in many different memory technologies.

Some of these technologies are easy to write and fast, but extremely volatile such as DRAMs, others can be stable for years (FLASH, HDD), or decades (LTO), but are slower to write, slower to read, and require more energy to set states. While a variety of new solid-state technologies including memristors and phase change materials (PCM) are aiming to become the next generation of memory technologies, they are still likely to fall short of universality.

On the other hand, biological systems solved this problem billions of years ago using nucleic acid-based memories. In an average adult human, 50-70 billion new nucleated cells are created each day. Each nucleus contains a copy of the entire genome for that person (~3 billion base pairs), and as there are four DNA bases (guanine (G), adenine (A), thymine (T), and cytosine (C)), each base encodes 2 bits. Thus, the average human writes ~40 exabytes ($40 \times 10^{18}$) of data each day. Even more impressively, this feat is achieved while running at an average energy consumption of ~100 W ($8.4 \times 10^6$ J/day), and only a small fraction of this energy goes to writing DNA.

By comparison, even the best modern storage technologies would require $3.2 \times 10^9$ J, to write the same amount of information, which is 3 orders of magnitude more energy. Biological systems achieve this level of efficiency by using enzymes to create the bonds between bases and write new copies of genomic DNA. This capability significantly lowers the energy barrier to writing data and has the added advantage of writing it in strong, stable, covalent bonds. In proper storage conditions (no nucleases present) DNA can be stable for hundreds of years, and in some cases, it has even survived for millions of years.

Accordingly, there is a need for a universal memory technology that is nucleic acid based, electrically readable, memory (ROM) that is capable of interfacing with conventional semiconductor technologies for long-term data storage.

BRIEF SUMMARY

Nucleic acid-based memory devices and systems for encoding digital memory states in DNA-based nanostructures, for example, are described. The technology is illustrated with a cross-wire (X-wire) ROM architecture with separated top and bottom nanowires interconnected at junctions with highly-conductive, self-assembled, nucleic acid-based nanowires with selected conductivity forming memory units. The memory units (at the X-wire junctions) have controllable conductance values for encoding bit values. The self-assembly processes are also addressable to allow control over bit placement.

The cross-wire system is illustrated with memory elements using 4 nm width wires with 4 nm separations to create a 2-dimensional memory with an areal density of $2.5 \times 10^{11}$ bits/cm$^2$ (assuming 1-bit per element). This density is on-par with current technology projections. Moreover, the size could be reduced by another factor of at least 2 (per dimension), more bits could be encoded per memory element, or the memory could be assembled in 3-dimensions. The combination of these approaches will allow for memory densities that are 4-5 orders of magnitude higher than conventional technologies.

In this scheme, the bases of the nucleic acids will not be used to encode the information directly, but they will be used to self-assemble a cross-wire (X-wire) nanostructure using nucleic acid origami-like techniques (including "DNA brick" structures) where the conductance of the DNA-linkages between the wires encodes the information. In effect, the electronic memory system leverages synthetic biological approaches for fabricating and programming memories, but also requires conventional semiconductor and lithography processes to contact each of the nucleic acid nanowires for electrical read-out.

DNA nanowires and other nucleic acid nanostructures are preferably formed by one of two DNA nanowire self-assembly strategies: DNA origami and DNA bricks or tiles, for example. In DNA origami, a scaffold strand is folded into a prescribed shape by hybridizing with staple strands. In DNA brick self-assembly, hundreds of DNA bricks, each consisting of a distinct sequence, assemble to a large structure. Similar processes occur with other nucleic acid assemblies. Although these approaches are preferred, other known methods of nanowire or nanoribbon fabrication can be used to form the cross-wire architecture.

The nucleic acid cross-wire architecture has two main components: the nucleic acid-based nanowires and the memory elements. First, the nucleic acid nanowires should be long, conductive wires, with controlled placement, and second the interconnecting memory element should be a short component with a controlled resistance value. This element must be capable of being configured in different conductance values to represent different bit values.

To encode different bit-values into the memory elements, and, to ensure that the memory elements can be properly read in an electrical architecture, the physical properties of the nucleic acid nanostructure (sequence, length, conformation, doping, and number of pathways) are controlled.

The conductivity of the nucleic acid (DNA, RNA and hybrid etc.) nanowires and structures can also be modified and controlled to allow the coding of multiple bits per junction (e.g. 4-values 00, 01, 10, 11). In addition to sequence differences, the nucleic acid nanowires can be modified with metal ion doping, enhancement with metal nanoparticles, or molecular doping with intercalators. In one embodiment, the dopant can be reduced or oxidized by the applied current. Changing the charge states of these systems will change the conductance, and thereby provide a mechanism for writing a digital value.

Although DNA is used to illustrate the nucleic acid nanowires and memory elements, other nucleic acids can also be used to form the conductive elements of the cross-wire array. In addition to DNA, RNA and DNA:RNA hybrids can be used. Likewise, artificial or modified nucleic acids such as threose nucleic acid (TNA), peptide nucleic acid (PNA) Glycol nucleic acid (GNA), locked nucleic acid (LNA), bridged nucleic acid (BNA) and phosphorodiamidate morpholino oligomer (PMO) can also be used. Other molecules can be used as the linkage between the nanowires as the memory storage components can be used as well.

The conductivity of the nucleic acid nanowires and memory structures can also be modified with dopants such as conductive metal nanoparticles and conductive carbon, such as carbon nanotubes, carbon nanorods, carbon black, graphene sheets, graphene nanoribbons, and carbon nanofibers.

The conductivity of the nucleic based nanostructures can also be modified by molecular doping with intercalators such as anthraquinone, ferrocene, norbornadiene, methylene blue, ethidium, coralyne and cryptolepin. Nucleic acid intercalation involves the insertion of one intercalating moiety (mono-intercalator), two intercalating moieties (bis-intercalator) or multiple intercalating moieties into the nucleic acid structure. Intercalation changes the conduction/resistance of the complex influencing the overall conduction characteristics of the nucleic acid strand.

One important issue with nanowires is the "sneak path problem, where high-resistance elements are misread because the current flowing through adjacent elements and wires back to the read-line is higher than that through the intended element. However, the programmed self-assembly process can be used to address this issue in nucleic acid-based systems. To circumvent this problem, a diode can be connected in series with each of the memory elements, as this prevents current from "sneaking" back to the read-line. An advantage of the nucleic acid technology here is that it is possible to program the self-assembly process to include a DNA-based diode in series with the DNA-based memory element, for example.

Benefits of the present technology may include higher memory density, long-lifetime storage, non-volatility, integration with conventional electronic devices, and low-cost fabrication.

There will be a wide-variety of important applications for DNA-based, Read-Only-Memories (ROMs) including archiving and data storage and transfer and on the architecture of modern processors. For example, the memory can be included either within or adjacent to processors to provide look-up-tables (LUTs) or hard-coded executable programs for the processor.

Mask ROMs, which are hardware encoded memories that are programmed at the time of manufacture (by the mask), are used in microprocessors for bootstrapping and other critical functions. While mask ROMs can be fast and inexpensive, their use is limited because changing the program requires starting from a new mask design. However, a hardware-encoded ROM that is ultra-high-density, fast, inexpensive, and capable of implementing revisions within the manufacturing process without requiring new mask design could change the way processors are designed. A DNA-ROM could be used to store "mission-critical" code that cannot be altered by nefarious actors and could speed up boot-up and runtime for important programs.

Moreover, because the nucleic acid-ROM is such high density, implementing it in or near a core could simplify many of the most expensive computational problems such as performing division or calculating logarithms. Rather than calculating these values, they could simply be pulled from a DNA-ROM based LUT. This architecture could leverage the current trend of increasing the number of cores within a processor, to allow further specialization of the cores based on the specific memories that are implemented with them. This architecture could yield thousands of cores within a processor which each have specific functions depending on the memory encoded in the nucleic acid-ROM that it can access.

It is important to note that in such a scheme, it may not be possible to reprogram the memories in the field, but if a design revision is required due to an error in the memory or a fault in the program, it would not require a new mask design, but instead simply recoding the nucleic acid-ROM that is implemented in future versions during manufacturing.

Further aspects of the technology described herein will be brought out in the following portions of the specification, wherein the detailed description is for the purpose of fully disclosing preferred embodiments of the technology without placing limitations thereon.

BRIEF DESCRIPTION OF THE SEVERAL VIEWS OF THE DRAWINGS

The technology described herein will be more fully understood by reference to the following drawings which are for illustrative purposes only.

DETAILED DESCRIPTION

Referring more specifically to the drawings, for illustrative purposes, embodiments of apparatus, system and methods for nucleic acid based cross-wire memory structures are generally shown. Several embodiments of the technology are described generally in FIG. 1A to FIG. 4 to illustrate the characteristics and functionality of the devices, methods and systems. It will be appreciated that the methods may vary as to the specific steps and sequence and the systems and apparatus may vary as to structural details without departing from the basic concepts as disclosed herein. The method steps are merely exemplary of the order that these steps may occur. The steps may occur in any order that is desired, such that it still performs the goals of the claimed technology.

To effectively implement a high-density, cross-wire system from DNA there are two primary capabilities: a) it must be possible to encode and read specific digital values from the conductance to create memory elements, and b) it must be possible to interconnect these elements with highly conductive, small width interconnects. These interconnects would be "wires" that display a large conductance over long distances to ensure that i) the conductance of the memory elements dominate the conductance of the system, and ii) that the readout can be sufficiently fast to allow these systems to be introduced as Random Access Memories (RAMs) that can be implemented near or within the overall CPU architecture to improve computation. These capabilities are met with a simple memory element design with bit elements with controllable conductance characteristics.

Figure 1A:
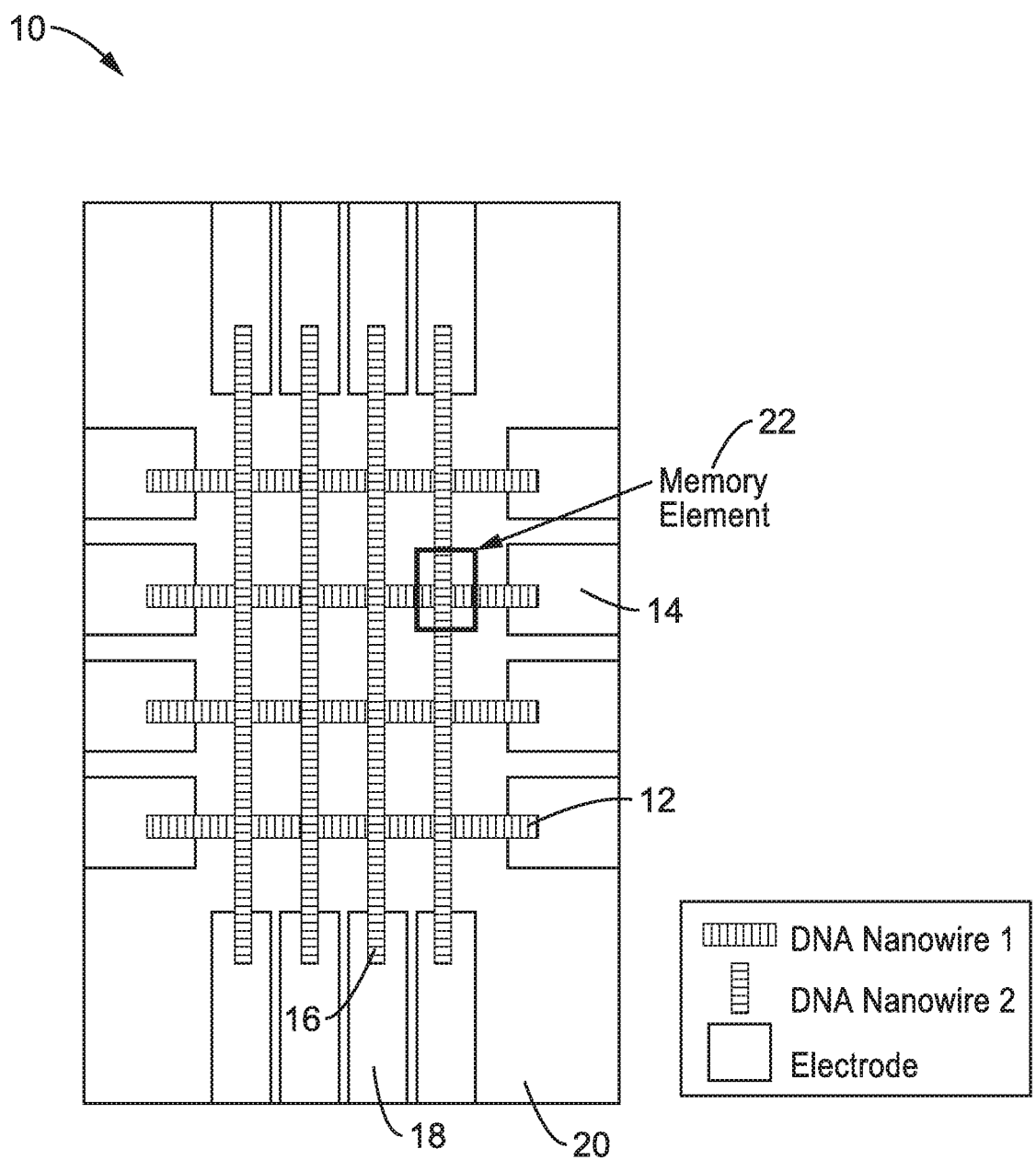
FIG. 1A is a schematic top-view of a nucleic acid cross-wire system with contacting electrodes for memory read-out according to on embodiment of the technology.
Figure 1B:
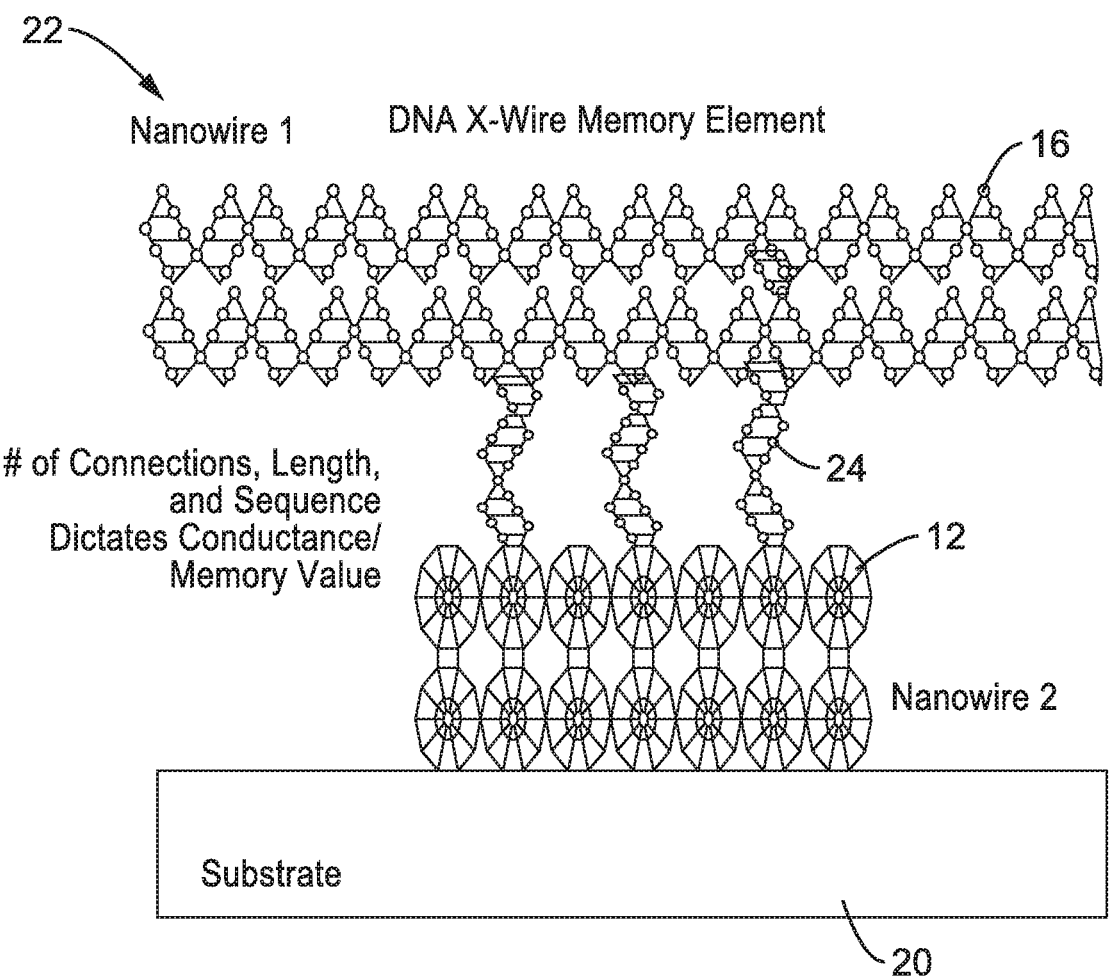
FIG. 1B is a simplified schematic side-view of a memory element with crossed nanowires on top and bottom, and an interconnecting memory element that encodes bits connecting the two crossed nanowires.

Turning now to FIG. 1A and FIG. 1B, one embodiment of an electrically readable, 4×4 element, 32-bit, nucleic acid X-wire ROM (Read Only Memory) platform 10 is shown schematically and is used to illustrate the technology. The platform 10 can be useful in a variety of systems such as for long-term storage or look-up-tables for time consuming calculations such as logarithms. For simplicity, the platform of FIG. 1A depicts four lower wires 12 and four upper wires 16 oriented cross ways at right angles to each other. However, the upper and lower nanowires or structures can be can be different shapes, non-uniform sizes and may be oriented at oblique angles to each other. In this illustration, each of the lower nanowires 12 are electrically coupled to an electrode 14. Each of the upper overlapping nanowires 16 are also mounted to their own electrodes 18 that are supported by a substrate 20. The electrodes 14, 20 are in contact with appropriate circuits (not shown) for memory read-out. The nucleic acid-based memory technology is interfaced with conventional semiconductor technologies and the information can be directly accessed electrically. Memory elements 22 are formed at the junctions between overlapping nanowires or nanostructures.

In the side view of the memory element 22 shown in FIG. 1B, it can be seen that the lower nanowire 12 and the overlapping upper nanowire 16 are interconnected together at the junction by one or more memory DNA or RNA based nanostructures 24 that encodes bits. The number of connections, length and sequence of the memory nanostructures 24 dictates conductance and memory value. Different bit-values can be encoded into the memory elements 22 by controlling the physical properties of the nucleic acid nanostructure 24 by selection of sequence, length, conformation, doping, and number of pathways.

Figure 2:
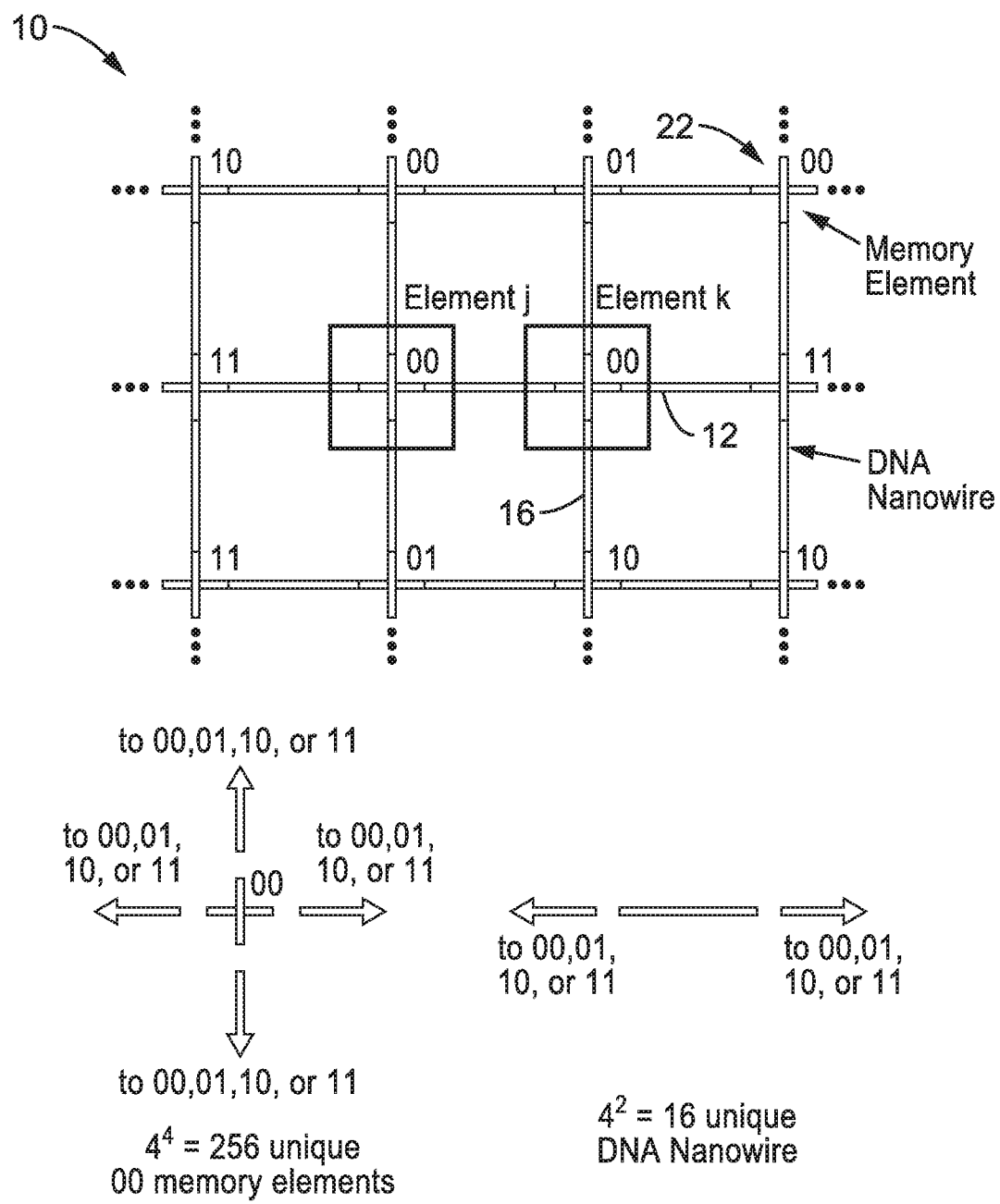
FIG. 2 is a schematic diagram of a cross-wire structure showing 2-bit memory elements connected with nucleic acid nanowires and an example of the number of permutations possible on a 00-memory element and DNA-nanowire structures.

FIG. 2 shows an idealized version of the structure of FIG. 1A and FIG. 1B that has a set of 2-bit encoded memory elements interconnected with nucleic acid-based nanowires. Here, specific sequences are identified that can be used to encode a 2-bit (4-level) architecture that covers 4 orders of magnitude of conductance. This is feasible because nucleic acids such as DNA are conductors in which carriers are often delocalized over several bases at a time. To set these bit values modulating the conductance values between approximately $1 \times 10^{-6}$ $G_0$ and approximately 0.01 $G_0$ is preferred. By controlling the electronic structure of DNA memory nanostructures and nanowires, for example, 4 DNA duplexes of similar lengths (~20 bp to 200 bp) that have conductance values that are each separated by 1 order of magnitude can be organized.

In the scheme of FIG. 2, it is possible to read multi-level logic states (i.e. conductance values related to 00, 01, 10, and 11) from the combined system. To achieve this, in one embodiment, contact is made with the electrodes of all four legs of the X-wire device using standard lithography and substrates 20. For example, post-deposition electron beam lithography can be used to make contact after the X-wires have been deposited. In another embodiment, thiolated single-strand linkers are used on each of the 4-electrodes.

Each of the electrodes can be programmed with a different sequence by controlling the potentials on the electrodes during assembly. In the preferred embodiment, each of the DNA-nanowires at the end of the X-wire junction will have a sticky end that is complementary to a single electrode. The nanowires are then allowed to self-assemble on the surface in the presence of the functionalized electrodes. Employing a large number of electrode sets on the surface will ensure successful measurements and will allow for a statistical analysis of the variability of the structures.

Obviously, for a memory system to be functional, the position of the bit-values cannot be randomly determined during the self-assembly process. These systems must be addressable. Fortunately, DNA is an ideal tool for structural programming, even using short 10 bp sticky-ends to link memory elements to DNA-nanowires would allow for $4^{10}$ unique combinations (addresses). In fact, a variety of lengths can be used, along with parallel sticky-ends at the interface, opening up an extremely large design space for controlling the location of specific bit-values.

Referring back to FIG. 2, the control of the characteristics of the 2-bit memory elements connected with nucleic acid nanowires with 4 orders of magnitude of conductance provide an encoding scheme. In principle, Element j and Element k shown in the illustration of FIG. 2 are identical as each encodes a 00-bit. However, each of these bits have unique nearest-neighbors, and in order to ensure that each address encodes the proper bit-value in the final structure, these two elements must actually be different physically even though they encode the same digital value. FIG. 2 illustrates all of the possible values for the 00-bit, which result in 256 different memory elements that all encode the same digital value. Also, since there are 4 possible digital values (00, 01, 10, and 11), 1024 unique memory elements are needed to encode all possible linkages for a 2-bit logic system.

In addition, each of the nanowires that interconnects the memory elements should also be specific, resulting in another 16 elements. Thus, a complete design will require at least 1040 unique nucleic acid structures for implementation. In one embodiment, each element may need to be completely unique to limit the growth process to ensure that each element only attaches at the desired locations i.e. at a unique address. This would require optimal sequence design algorithms that minimize unwanted interactions. Therefore, for a given ROM pattern, the system will encode each memory element not only with a bit-value, but with an address as well to allow them to self-assemble into the correct structure.

The crossed nanostructured platform is preferably formed on an arbitrarily sized, recessed, electrode arrays on a $SiO_2$ or $Si_3N_4$ insulated substrate to ensure that the memory elements can be properly read in an electrical architecture. In this embodiment, the nanostructured materials are deposited on a planar surface that provides better electrical contact and reduces shearing forces at the electrode/nanostructure interface that often causes materials to rupture or inhibits transport.

It is also possible to direct the assembly of the memory elements or array using either electrically-assisted methods (e.g. dielectrophoresis), or chemical direction (modifying surface interactions using thiols, hydroxyls, carboxylic acids, etc. on the surfaces. For example, these surface modifications can be controlled lithographically for precision placement.

Using these structures, preliminary electrical measurements on nucleic acid nanowires indicated that even over distances of ~10 μm currents in the pA range can be obtained. Moreover, these devices increase in conductance when conductivity is enhanced or optimized with intercalators or metals are used to dope the devices. This indicates that these structures have inherent long-range transport properties at room temperature.

The preferred approaches for constructing nucleic acid nanostructures fall into two categories: the folding of a long strand (often called "DNA origami") and the assembly of modular units called DNA tiles. Nucleic acid origami folding can create arbitrary two-dimensional nanoscale objects. A long scaffold strand (typically a M13 viral genomic DNA, ~7 k bases) is folded into a prescribed shape by interacting with approximately 100 to 200 synthetic "staple" strands. Each staple strand is programmed with unique sequences and occupies a specific position in the final shape. In order to generate a custom-shaped nanostructure, one simply needs to raster-fill the shape with scaffold strands and then generate complementary staple sequences accordingly. The origami method was later extended for making 3D nanostructures. DNA origami is the first DNA self-assembly approach that allowed the building of arbitrarily-shaped, large (seven thousand base-pairs), addressable (each staple is unique) nanostructures.

Another example is a modular strategy that can efficiently assemble large DNA-origami monomers into larger polyhedral structures. DNA-brick and DNA-origami modular assembly approaches can be extended for constructing microscale two-dimensional DNA crystalline structures and DNA nanowires. The 1D DNA nanowire design is based on discrete three-dimensional DNA brick structures, by implementing "connecting bricks" between discrete DNA brick structures. The nucleic acid nanowire can typically grow to several micrometers in length.

In comparison, DNA-tile self-assembly is typically a two-step hierarchical process. The first step involves the formation of DNA tiles, which normally consists of a few to dozens of short synthetic DNA strands. Individual DNA tiles then connect to others through hybridization between complementary single stranded overhangs ("sticky ends"). A special type of DNA tile called a "single-stranded-tile (SST)" or "DNA brick" have been successfully used for assembling large 2D structures and 3D structures.

The successes of the complex self-assembly that uses only short strands (as in DNA bricks) and those that includes a long scaffold (as in DNA origami) together suggest a full spectrum of motif possibilities with strands of diverse lengths: longer strands may provide better structural support, and shorter strands have finer modularity and features are available for use with controlled wire and memory bit conductivity.

There are two general methods for creating conductive nanowires from DNA. The first involves using nucleic acids as a template to grow either inorganic or conducting polymer-based nanowires. These techniques typically involve binding to a catalyst for wire growth or a sticky end that can attach to an appropriately functionalized nanoparticle. These approaches have had success in creating conducting channels with a shape defined by the underlying nucleic acid nanostructure. However, they can suffer from low overall conductivity if the grains in the wire are not well coupled. Thus, the growth process must be carefully controlled to result in high conductivity.

The second approach is to dope the nucleic acid using either intercalators or metal ions to improve the native conductivity of the material. While the second approach maintains the size of the nucleic acid nanostructures, it allows for a more straightforward implementation of the cross-wire architecture without needing to assemble around inorganic wires. Either approach can be implemented to ensure higher conductance wires.

Another aspect of optimization and control over conduction is the enhancement of conductivity of the nucleic acid structures with one of three approaches: 1) metal ion doping; 2) doping with metal nanoparticles; and 3) doping with intercalators.

One approach to doping the nucleic acids focuses on inserting metal ions at specific locations within the nucleic acid stack by using either modified bases to bind metal ions, or by using mismatches to ligate a metal ion to improve stability. For instance, in one embodiment, the use of a salicylic aldehyde-salicylic aldehyde pair in place of two complementary bases (one base on each strand), allows the DNA duplex to bind a range of metal ions including $Cu^{2+}$, $Fe^{3+}$, and $Ag^+$. Alternatively, a T-T mismatch is known to bind $Hg^{2+}$. These alternative pairing schemes may be used at specific locations in the DNA nanostructures by including these bases (and base substitutes) in the design of the DNA bricks described above. Conductance can be modulated when ions are spaced by every 3, 5, 7, or 9 base pairs, or quasi-randomly spaced.

Another enhancement to conductivity of nucleic acids may be with the association of metal nanoparticles with the DNA, RNA or hybrid nanowire. For example, in one embodiment, gold nanoparticles, including spherical nanoparticles and nanorods, can be incorporated into DNA nanostructures to optimize the conductance. It is possible to attach controlled numbers of gold nanoparticles to DNA nanowires in a tight one-dimensional arrangement. The alignment of gold nanorods can be accomplished via a facile and robust hybridization between free DNA "sticky-ends" exposed on the DNA nanowires and complimentary DNA strands bound to the gold nanoparticles. The alignment of gold nanoparticles can be optimized by tuning the reaction conditions (e.g. concentrations, reaction time), and the design (e.g. DNA lengths and sequences).

Similarly, the nucleic acid nanowires can be modified using conductive carbon dopants such as carbon nanotubes, carbon nanorods, carbon black, graphene sheets, graphene nanoribbons, and carbon nanofibers. Conductive carbon dopants can be used alone or with other dopants such as metal nanoparticles.

Alternatively, conductivity can be enhanced and controlled through improving the inherent transport properties of DNA using DNA intercalators and groove-binding molecules to dope the nucleic acid nanostructures. Intercalators are molecules that insert into the DNA $\pi$-stack.

Figure 3B:
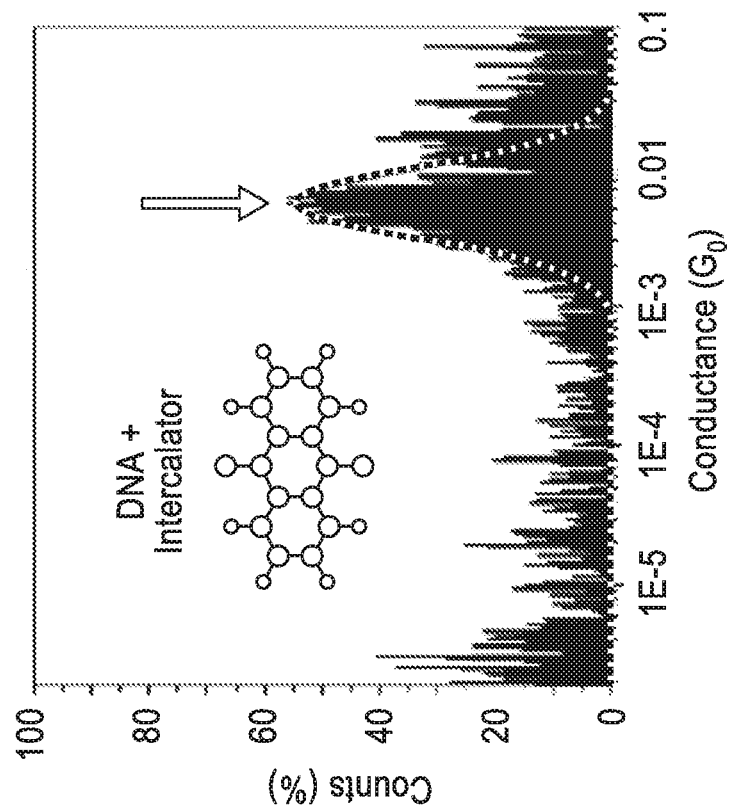
FIG. 3B is a graph of conductance of the same sequence of FIG. 4A with an intercalator. The observed HOMO-LUMO gap decreases by half when the intercalator is inserted into the stack and the conductance of the DNA hybrid changes by over 3 orders of magnitude when the intercalator is present.
Figure 3A:
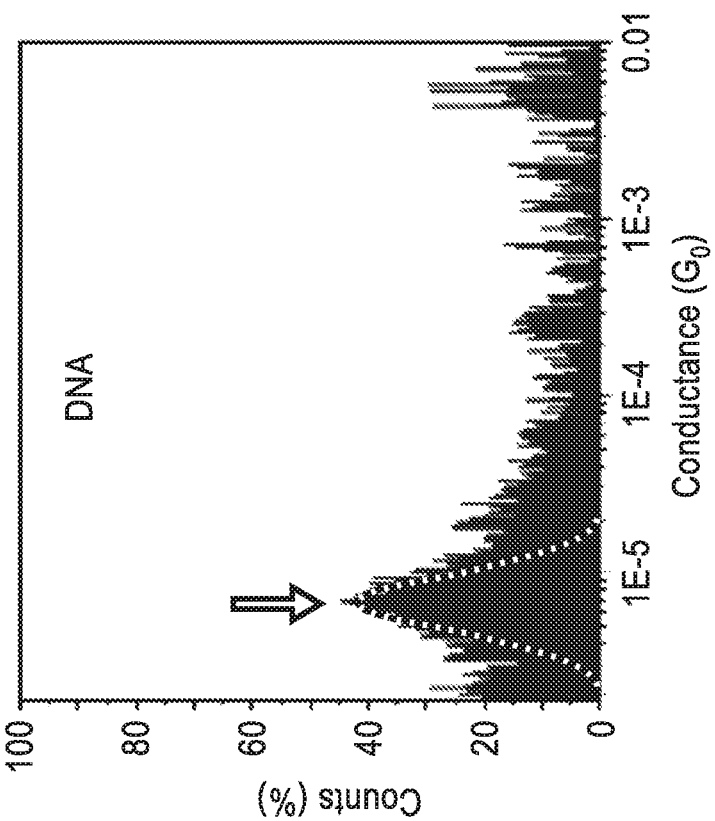
FIG. 3A is a graph of conductance of a native 15-bp DNA-RNA stack.

An example of the conductance of a DNA sequence without an intercalator is shown in FIG. 3A and the same sequence with an intercalator is shown in FIG. 3B. These demonstrate that adding an anthraquinone-based intercalator to DNA changes the energy gap between the Highest Occupied Molecular Orbital (HOMO) and Lowest Unoccupied Molecular Orbital (LUMO) from approximately 3.7 eV to approximately 1.5 eV. In addition to this significant decrease in the energy gap, the energy levels are more delocalized over the entire length of the nucleic acid. These changes to the electronic structure result in an experimentally determined conductance value that is 3 orders of magnitude higher for a 15-basepair (bp) sequence with the intercalator present over the sequence alone as shown in FIG. 3A and FIG. 3B.

Given this substantial change in the transport properties, and, the relative ease of introducing these molecules into DNA-nanostructures, the use of intercalators are suitable for controlling or optimizing the transport properties of the DNA-nanowires. Several different intercalators can be selected to control conductance. Molecules with low redox potentials, such as anthraquinone and methylene blue, are preferred as these add energy levels near the Fermi potential of the Au electrodes.

Additionally, the selection of intercalators can include classes of molecules aimed at lowering the LUMO level (such as anthraquinone), and classes of molecules aimed at increasing the HOMO level (such as methylene blue). After an initial examination of both classes, the best performers in each class can be used in tandem to further reduce the HOMO-LUMO energy gap of the system. The overall goal is to introduce enough additional states, with sufficient proximity to one another (both spatially and energetically) to approach long-range quasi-ballistic transport in the DNA nanowires.

In another embodiment, a Programmable ROM (PROM) is provided. The metal ion or intercalator dopants are chosen, in-part, because of their redox or electroactive switching properties. Dopants that can be reduced or oxidized by the applied current will change the charge state. Changing the charge states of these systems changes the conductance, and thereby provides a mechanism for writing a digital value.

Preferred redox or electroactive switching molecules or nanoparticles include Au, PbS, PbSe, Ge, and Ag. The charge state of the nanoparticle can change the resistance. One phenomenon that causes this is Coulomb Blockade. Preferred electroactive switching molecules include Methylene Blue, Ferrocene, Anthraquinone, Norbornadiene, and various fluorophores.

A combination of these approaches will allow the identification of specific sequences that can be used to encode a 2-bit (4-level) architecture that covers 4 orders of magnitude of conductance, for example. Distinct conductance or resistance states can be engineered by designing specific DNA sequences, structures and enhances structures.

Single-molecule break-junction (SMBJ) and lithographically-based conductance measurements reveal that the conductance is sensitive to the sequence, length and conformation. The results show that increasing the number of G:C (guanine:cytosine) base pairs in the stack causes a systematic increase in the resistance regardless of the conformation (A-form or B-form). The DNA can be switched between these conformations in situ by controlling the environment, and the A-form is consistently about 8 times lower in resistance than the B-form. This surprising result is due to increased delocalization of the HOMO levels in the A-form.

It has also been established that the conductance is sensitive to a single-base mismatch in both double stranded DNA and DNA:RNA hybrids, for example. It is also interesting to note that some mismatches have a conductance that is too small to measure, giving it a very distinctive resistance value to use as a potential memory element.

Overall, the results on different DNA and DNA:RNA systems demonstrate approximately 3 orders of magnitude change in conductance depending on both length and sequence. This implies that it is possible to directly identify two sequences with very different conductance values that could be used to encode a single bit (0 and 1) directly. For instance, the sequence 5'-GCGCGCGC-3' (plus complement) has a conductance of about $1 \times 10^{-3}$ $G_0$, where SEQ ID NO: 1 (plus complement) has a conductance of about $7 \times 10^{-6}$ $G_0$ ($G_0$ is the conductance quantum). The significant difference between these two sequences can be used for initial single bit memory element designs.

One intriguing feature of DNA from an electronics standpoint is its 1D, quantum transport properties. While there have been differences of opinion about whether individual bases in DNA behave as independent hopping sites, it has recently become clear that charge carriers are often delocalized over several bases within the stack, as can be seen from the observed distributed HOMO levels. Studies on short DNA duplexes have indicated that in GC systems, transport occurs via delocalized states on the oligonucleotide chain while short AT base pairs provide a tunneling barrier.

Taking advantage of the quantum transport properties of DNA or other nucleic acids or hybrids will provide additional control over simply modifying only the length of DNA or number of interlinking strands and allow the design of sequences where the resistances can be controlled at various values (beyond two) for multi-bit storage.

Manipulation of the effects of the quantum mechanical nature of charge transport in DNA will also allow the development of multi-bit memory elements capable of overcoming the sneak-path problem noted below.

In order to clearly distinguish between two conductance-encoded digital values, their conductance values must be significantly separated. As noted above, one important issue to developing a cross-wire based resistive memory array is ensuring that the resistances can be properly read. The concern is that if a voltage is applied to one horizontal line and the current is measured from one vertical line to read a single element, then there are other possible pathways that can contribute to the overall current that is read. If the memory element has a high resistance, then these other pathways with lower resistance can dominate the current and misread the value as a result.

From an architectural perspective, this issue can be circumvented by connecting a diode in series with the memory element lying between the vertical and horizontal nanowires. In the nanoscale memories proposed so far, these diodes lead to two difficulties. First, they lower the memory density because of the area occupied by the diode, and second, they increase fabrication complexity because the memory elements are based on a new technology while the diode are based on silicon. The advantage of the DNA technology proposed here is that it is possible to program the self-assembly process to include a DNA based diode element in series with the DNA-based memory element between the vertical and horizontal nanowires. Modeling by MPA shows that the sequence SEQ ID NO: 2 will serve as a diode (as a result of the ionization potential difference between the G's and T's). It has also been demonstrated that coralyne intercalators or alternative bases can provide this rectification.

Figure 4:
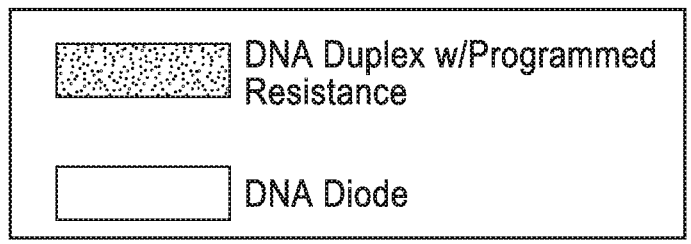
FIG. 4 is a perspective view of a nucleic acid memory element with sequences capable of encoding digital values combined with DNA-diodes in a memory element with multiple, parallel paths that can be functionalized with Au nanoparticles (or nanorods) according to one embodiment of the technology.
Figure 4:
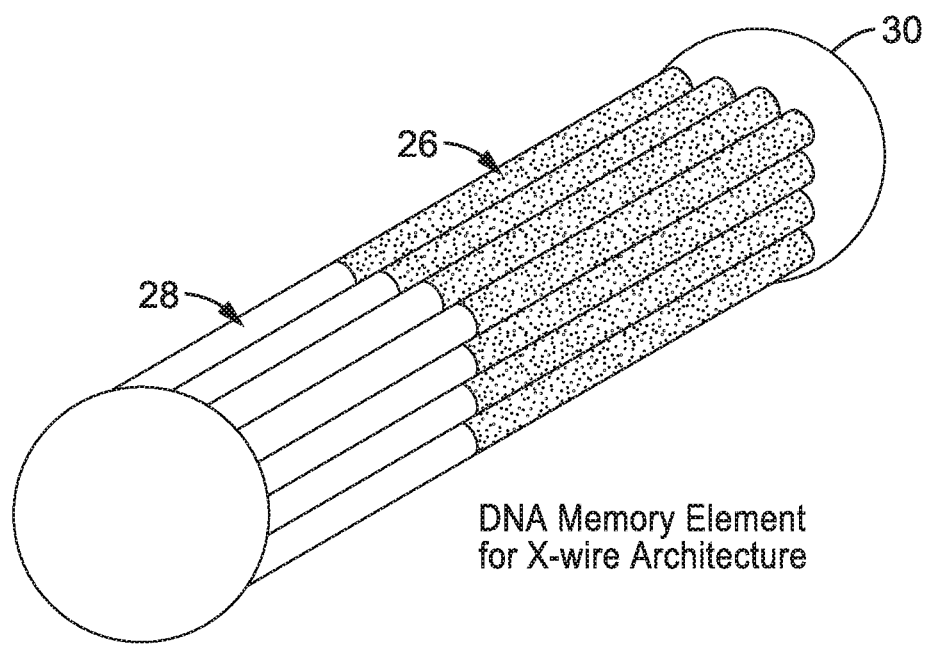

In the embodiment shown in FIG. 4, one DNA memory element 24 has a combination of DNA sequences 26 capable of encoding digital values with a DNA diode-resistive sequence 28 in a system with multiple, parallel paths. The memory elements can be functionalized with gold nanoparticles 30 or nanorods.

The technology described herein may be better understood with reference to the accompanying examples, which are intended for purposes of illustration only and should not be construed as in any sense limiting the scope of the technology described herein as defined in the claims appended hereto.

Example 1

To demonstrate the functionality of DNA-origami nanowire fabrication methods, an approximately 1.25 µm long DNA-origami nanowire was designed and fabricated by an end-to-end hierarchical assembly of five 10HB bundles of DNA nanorods. The 10HB DNA nanorod monomer was selected as the building block because of its increased rigidity and longer persistence length compared to nanorod designs with fewer helix bundles. The 10HB nanorod monomer was designed in caDNAno and verified by transmission electron microscopy (TEM). Selected staple strands were modified with a handle domain extension complimentary to a fluorescence-dye-labelled DNA strand to incorporate multiple fluorescence dyes for fluorescence microscopy imaging.

To create the 1.25 µm DNA-origami nanowire, five 10HB nanorod monomers were connected together by outfitting five identical nanorod samples with a pair of unique sticky ends. With each nanorod bearing 24 handle extensions, a total of 120 fluorophores could be incorporated into each nanowire. Additionally, five capture handles for a thiol modified DNA strand extend from either end of the pentamer nanowire (the first 10HB nanorod monomer and the last 10HB nanorod monomer) to enable immobilization of the wires onto gold substrates.

The five 10HB nanorod monomers were assembled separately in buffer and then mixed together at equal concentration to create the 1.25 µm DNA-origami nanowire, which was then purified by native agarose gel electrophoresis. Purified DNA nanowire was imaged by TEM (under dry conditions) and fluorescence imaging in aqueous solution. The overall morphology of the DNA nanowire was clearly confirmed in the TEM images. Fluorescence microscopy, including total internal reflection fluorescence (TIRF) microscopy and epifluorescent microscopy, also verified the successful assembly of the DNA nanowire under native condition in aqueous solution.

After creating the DNA origami-based nanowire structures they were placed on a surface of a substrate and in contact with electrodes. The nanowires were placed on a substrate for initial electrical characterization, and on a second substrate for precision placement using Dielectrophoresis.

First, the thiol- and fluorescent-modified DNA origami structures described above were placed on an electrode array chip for electrical characterization. This structure allowed testing of the initial conductance values of the DNA and to test conductance modification schemes (doping, intercalation, etc.). The electrodes were recessed into the substrate (oxide or nitride insulating layer) to create a planar structure for the DNA Nanowire to sit across. The DNA nanowires were placed on the surface by incubating the surface in a solution of nanowires after carefully cleaning the surface. Because of the fluorescent modifications to the DNA nanowires, they were able to be imaged via fluorescence microscopy to determine which sets of electrodes are bridged by DNA nanowires for electrical characterization. The resistance of the DNA nanowire was shown to decrease by incubating the system with an intercalator with favorable electrical properties (an anthraquinone based intercalator was used here). This demonstrated that the DNA nanowire conductance can be tuned over a large range.

Example 2

To further demonstrate the operational principles of the apparatus and methods, modified and unmodified DNA nanowires of different sequences and lengths were evaluated. DNA conductance values can span a large range to allow multiple bits to be stored within each X-wire junction was demonstrated. The effects of intercalation, metal ion doping and metal nanoparticles on the conductance of the DNA nanowires was determined by comparing the conductance of native and modified nanowires.

Conductance values of two examples of DNA nanowires differed by nearly 3 orders of magnitude are shown in FIG. 3A and FIG. 3B. In this case the sequence is the same, but an intercalator was used in the higher-conductance case to change the resistance. These measurements directly demonstrate sufficient separation of conductance values of short DNA systems to serve as memory elements. For example, these two elements could be used as a 0 and 1 respectively, but other modifications and various changes in sequence could be used to allow the coding of multiple bits per junction (e.g. 4-values 00, 01, 10, 11).

Example 3

To further demonstrate the operational principles of the apparatus and methods, precision placement of the DNA nanowires on a substrate was demonstrated with a variety of schemes. Dielectrophoretic trapping was used to illustrate one preferred approach to positioning of DNA nanowires. In this approach, a high frequency (MHz range) AC field was applied between two electrodes. Because the DNA+counterion system is polarizable, the AC field induces a polarization which creates a force on the DNA that is parallel to the field gradient. Consequently, the DNA origami element is driven toward the source of the driving field.

A chip for performing dielectrophoresis was used that concentrates the field gradient in the area of interest. A 6 MHz AC field, amplitude between 0.7 V and 1.0 V, was applied for 6 to 11 minutes to the junctions to trap and orient DNA-origami based nanowires. Fluorescent images of dielectrophoretically trapped DNA-origami based nanowires were observed.

The optimum electrical conditions to trap DNA (and recognize the binding due to the change in the dielectric response of the junction) was identified. It was possible to concentrate the DNA in the junction between the two electrodes and to obtain only a small number of DNA-origami between the electrodes. Continued optimization allowed trapping of a single DNA nanowire.

From the description herein, it will be appreciated that the present disclosure encompasses multiple embodiments which include, but are not limited to, the following:

1. A cross-wire memory apparatus, comprising: (a) a first plurality of nucleic acid-based nanowires; (b) a second plurality of nucleic acid-based nanowires; wherein each nanowire in the first plurality of nucleic acid-based nanowires crossing over a nanowire in the second plurality of nucleic acid-based nanowires; and (c) a plurality of conductive memory elements, each the memory element connecting a first nanowire with a second nanowire; wherein each the memory element having a controlled conductance to encode a data bit.

2. The apparatus of any preceding or following embodiment, further comprising: a substrate; and a plurality of electrodes mounted to the substrate; wherein a first end of the nucleic acid-based nanowire is mounted to one electrode and a second end of the nucleic acid-based nanowire is mounted to a separate electrode.

3. The apparatus of any preceding or following embodiment, wherein the nucleic acid-based nanowires are assembled from a nucleic acid selected from the group of nucleic acids consisting of DNA, RNA, threose nucleic acid (TNA), peptide nucleic acid (PNA) Glycol nucleic acid (GNA), locked nucleic acid (LNA), bridged nucleic acid (BNA) and phosphorodiamidate morpholino oligomer (PMO).

4. The apparatus of any preceding or following embodiment, the nucleic acid-based nanowires further comprising conductive metal nanoparticles coupled to the nanowires.

5. The apparatus of any preceding or following embodiment, the nucleic acid-based nanowires further comprising conductive carbon coupled to the nanowires selected from the group consisting of carbon nanotubes, carbon nanorods, carbon black, graphene sheets, graphene nanoribbons, and carbon nanofibers.

6. The apparatus of any preceding or following embodiment, wherein the nucleic acid-based nanowires are modified with metal ion doping with ions selected from the group of ions consisting of $Cu^{2+}$, $Fe^{3+}$, $Cu^{2+}$ and $Ag^+$.

7. The apparatus of any preceding or following embodiment, the nucleic acid-based nanowires further comprising molecular doping with intercalators selected from the group of intercalators consisting of anthraquinone, ferrocene, norbornadiene, methylene blue, ethidium, coralyne and cryptolepin.

8. The apparatus of any preceding or following embodiment, wherein the memory elements comprise: one or more nucleic acid strands linking the first and second nanowires, the nucleic acid strands producing a characteristic conductance.

9. The apparatus of any preceding or following embodiment, wherein the characteristic conductance is controlled by sequence, length and number of linking nucleic acid strands.

10. The apparatus of any preceding or following embodiment, wherein the characteristic conductance is further controlled by metal ion doping of the nucleic acid strands with ions selected from the group of ions consisting of $Cu^{2+}$, $Fe^{3+}$, $Cu^{2+}$ and $Ag^+$.

11. The apparatus of any preceding or following embodiment, wherein the characteristic conductance is further controlled by doping the nucleic acid strands with conductive metal nanoparticles.

12. The apparatus of any preceding or following embodiment, wherein the characteristic conductance is further controlled by doping the nucleic acid strands with a conductive carbon dopant selected from the group consisting of carbon nanotubes, carbon nanorods, carbon black, graphene sheets, graphene nanoribbons, and carbon nanofibers.

13. The apparatus of any preceding or following embodiment, wherein the characteristic conductance is further controlled by molecular doping of the nucleic acid strands with intercalators selected from the group of intercalators consisting of anthraquinone, methylene blue, ethidium, coralyne and cryptolepin.

14. The apparatus of any preceding or following embodiment, wherein the nucleic acid strands of the memory elements are nucleic acids selected from the group of nucleic acids consisting of DNA, RNA, DNA:RNA hybrids, threose nucleic acid (TNA), peptide nucleic acid (PNA) Glycol nucleic acid (GNA), locked nucleic acid (LNA), bridged nucleic acid (BNA) and phosphorodiamidate morpholino oligomer (PMO).

15. The apparatus of any preceding or following embodiment, wherein the memory elements comprise: a plurality of nucleic acid strands with sequences capable of encoding digital values combined with diode sequences linking the first and second nanowires, the combined nucleic acid-diode strands configured as a memory element with multiple, parallel paths producing a characteristic conductance.

16. The apparatus of any preceding or following embodiment, wherein the diode is formed from an end of a nucleic acid strand with a sequence comprising SEQ ID NO: 2.

17. The apparatus of any preceding or following embodiment, wherein the diode is formed from an end of a nucleic acid strand incorporating coralyne intercalators.

18. The apparatus of any preceding or following embodiment, wherein the plurality of nucleic acid strands has sequences that are not identical.

19. A memory apparatus, comprising: (a) a substrate; (b) a plurality of electrodes mounted to the substrate; and (c) an array of cross-wire memory units, each unit comprising: (1) a first plurality of conductive nanowires, each nanowire having two ends with each end coupled to an electrode; (2) a second plurality of conductive nanowires, each nanowire having two ends with each end coupled to an electrode; wherein each nanowire in the first plurality of conductive nanowires crossing over a nanowire in the second plurality of nucleic acid-based nanowires; and (3) a plurality of nucleic acid-based memory elements, each said memory element connecting a first nanowire with a second nanowire; wherein each said memory element having a controlled conductance to encode a data bit.

20. The apparatus of any preceding or following embodiment, wherein nanowires of the first plurality of nanowires are oriented at a right angle to the second plurality of nanowires.

21. The apparatus of any preceding or following embodiment, wherein said first plurality of conductive nanowires and the second plurality of conductive nanowires are nucleic acid-based nanowires.

22. The apparatus of any preceding or following embodiment, wherein the nucleic acid-based nanowires are assembled from a nucleic acid selected from the group of nucleic acids consisting of DNA, RNA, threose nucleic acid (TNA), peptide nucleic acid (PNA) Glycol nucleic acid (GNA), locked nucleic acid (LNA), bridged nucleic acid (BNA) and phosphorodiamidate morpholino oligomer (PMO).

23. The apparatus of any preceding or following embodiment, wherein the memory elements comprise: one or more nucleic acid strands linking the first and second nanowires, the nucleic acid strands producing a characteristic conductance.

24. The apparatus of any preceding or following embodiment, wherein the characteristic conductance is controlled by sequence, length and number of linking nucleic acid strands.

25. The apparatus of any preceding or following embodiment, wherein the nucleic acid strands are modified by metal ion doping of the nucleic acid strands with ions selected from the group of ions consisting of $Cu^{2+}$, $Fe^{3+}$, $Cu^{2+}$ and $Ag^+$.

26. The apparatus of any preceding or following embodiment, wherein the nucleic acid strands are modified by doping with conductive metal nanoparticles.

27. The apparatus of any preceding or following embodiment, wherein the conductive metal nanoparticles are metals selected from the group of metals consisting of Au, PbS, PbSe, Ge, and Ag.

28. The apparatus of any preceding or following embodiment, wherein the nucleic acid strands are modified by doping with a conductive carbon dopant selected from the group consisting of carbon nanotubes, carbon nanorods, carbon black, graphene sheets, graphene nanoribbons, and carbon nanofibers.

29. The apparatus of any preceding or following embodiment, wherein the nucleic acid strands are modified by molecular doping with intercalators selected from the group of intercalators consisting of anthraquinone, ferrocene, norbornadiene, methylene blue, ethidium, coralyne and cryptolepin.

As used herein, the singular terms "a," "an," and "the" may include plural referents unless the context clearly dictates otherwise. Reference to an object in the singular is not intended to mean "one and only one" unless explicitly so stated, but rather "one or more."

As used herein, the term "set" refers to a collection of one or more objects. Thus, for example, a set of objects can include a single object or multiple objects.

As used herein, the terms "substantially" and "about" are used to describe and account for small variations. When used in conjunction with an event or circumstance, the terms can refer to instances in which the event or circumstance occurs precisely as well as instances in which the event or circumstance occurs to a close approximation. When used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" aligned can refer to a range of angular variation of less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values may sometimes be presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. For example, a ratio in the range of about 1 to about 200 should be understood to include the explicitly recited limits of about 1 and about 200, but also to include individual ratios such as about 2, about 3, and about 4, and sub-ranges such as about 10 to about 50, about 20 to about 100, and so forth.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

All structural and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

What is claimed is:

1. A cross-wire memory apparatus, comprising:
   (a) a first plurality of nucleic acid-based nanowires;
   (b) a second plurality of nucleic acid-based nanowires; wherein each nanowire in the first plurality of nucleic acid-based nanowires crossing over a nanowire in the second plurality of nucleic acid-based nanowires; and
   (c) a plurality of conductive memory elements, each said memory element connecting a first nanowire with a second nanowire; wherein each said memory element having a controlled conductance to encode a data bit.

2. The apparatus of claim 1, wherein said memory elements comprise:
   one or more nucleic acid strands linking said first and second nanowires, said nucleic acid strands producing a characteristic conductance.

3. The apparatus of claim 2, wherein said characteristic conductance is controlled by sequence, length and number of linking nucleic acid strands.

4. The apparatus of claim 3, wherein said characteristic conductance is further controlled by metal ion doping of said nucleic acid strands with ions selected from the group of ions consisting of Cu2+, Fe3+, Cu2+ and Ag+.

5. The apparatus of claim 3, wherein said characteristic conductance is further controlled by doping said nucleic acid strands with conductive metal nanoparticles.

6. The apparatus of claim 3, wherein said characteristic conductance is further controlled by doping said nucleic acid strands with a conductive carbon dopant selected from the group consisting of carbon nanotubes, carbon nanorods, carbon black, graphene sheets, graphene nanoribbons, and carbon nanofibers.

7. The apparatus of claim 3, wherein said characteristic conductance is further controlled by molecular doping of said nucleic acid strands with intercalators selected from the group of intercalators consisting of anthraquinone, methylene blue, ethidium, coralyne and cryptolepin.

8. The apparatus of claim 2, wherein said nucleic acid strands of said memory elements are nucleic acids selected from the group of nucleic acids 5 consisting of DNA, RNA, DNA: RNA hybrids, threose nucleic acid (TNA), peptide nucleic acid (PNA) Glycol nucleic acid (GNA), locked nucleic acid (LNA), bridged nucleic acid (BNA) and phosphorodiamidate morpholino oligomer (PMO).

9. The apparatus of claim 1, wherein said memory elements comprise:
   a plurality of nucleic acid strands with sequences capable of encoding digital values combined with diode sequences linking said first and second nanowires, said combined nucleic acid-diode strands configured as a memory element with multiple, parallel paths producing a characteristic conductance.

10. The apparatus of claim 9, wherein said diode is formed from an end of a nucleic acid strand with a sequence comprising SEQ ID NO: 2.

11. The apparatus of claim 9, wherein said diode is formed from an end of a nucleic acid strand incorporating coralyne intercalators.

12. The apparatus of claim 9, wherein said plurality of nucleic acid strands have sequences that are not identical.

13. The apparatus of claim 1, further comprising:
   a substrate; and
   a plurality of electrodes mounted to the substrate;
   wherein a first end of said nucleic acid-based nanowire is mounted to one electrode and a second end of said nucleic acid-based nanowire is mounted to a separate electrode.

14. The apparatus of claim 1, wherein said nucleic acid-based nanowires are assembled from a nucleic acid selected from the group of nucleic acids consisting of DNA, RNA, threose nucleic acid (TNA), peptide nucleic acid (PNA) Glycol nucleic acid (GNA), locked nucleic acid (LNA), bridged nucleic acid (BNA) and phosphorodiamidate morpholino oligomer (PMO).

15. The apparatus of claim 1, said nucleic acid-based nanowires further comprising conductive metal nanoparticles coupled to the nanowires.

16. The apparatus of claim 1, said nucleic acid-based nanowires further comprising conductive carbon coupled to the nanowires selected from the group consisting of carbon nanotubes, carbon nanorods, carbon black, graphene sheets, graphene nanoribbons, and carbon nanofibers.

17. The apparatus of claim 1, wherein said nucleic acid-based nanowires are modified with metal ion doping with ions selected from the group of ions consisting of Cu2+, Fe3+, Cu2+ and Ag+.

18. The apparatus of claim 1, said nucleic acid-based nanowires further comprising molecular doping with intercalators selected from the group of intercalators consisting of anthraquinone, ferrocene, norbornadiene, methylene blue, ethidium, coralyne and cryptolepin.

19. A memory apparatus, comprising:
   (a) a substrate;
   (b) a plurality of electrodes mounted to the substrate; and
   (c) an array of cross-wire memory units, each unit comprising:

(1) a first plurality of conductive nanowires, each nanowire having two ends with each end coupled to an electrode;

(2) a second plurality of conductive nanowires, each nanowire having two ends with each end coupled to an electrode; wherein each nanowire in the first plurality of conductive nanowires crossing over a nanowire in the second plurality of conductive nanowires; and (3) a plurality of nucleic acid-based memory elements, each said memory element connecting a first nanowire with a second nanowire; wherein each said memory element having a controlled conductance to encode a data bit.

20. The apparatus of claim 19, wherein said memory elements comprise:
one or more nucleic acid strands linking said first and second nanowires, said nucleic acid strands producing a characteristic conductance.

21. The apparatus of claim 20, wherein said nucleic acid strands are modified by doping with conductive metal nanoparticles.

22. The apparatus of claim 21, wherein said conductive metal nanoparticles are metals selected from the group of metals consisting of Au, PbS, PbSe, Ge, and Ag.

23. The apparatus of claim 20, wherein said characteristic conductance is controlled by sequence, length and number of linking nucleic acid strands.

24. The apparatus of claim 20, wherein said nucleic acid strands are modified by metal ion doping of said nucleic acid strands with ions selected from the group of ions consisting of $Cu^{2+}$, $Fe^{3+}$, $Cu^{2+}$ and $Ag^{+}$.

25. The apparatus of claim 20, wherein said nucleic acid strands are modified by doping with a conductive carbon dopant selected from the group consisting of carbon nanotubes, carbon nanorods, carbon black, graphene sheets, graphene nanoribbons, and carbon nanofibers.

26. The apparatus of claim 20, wherein said nucleic acid strands are modified by molecular doping with intercalators selected from the group of intercalators consisting of anthraquinone, ferrocene, norbornadiene, methylene blue, ethidium, coralyne and cryptolepin.

27. The apparatus of claim 19, wherein said first plurality of conductive nanowires and said second plurality of conductive nanowires are nucleic acid-based nanowires.

28. The apparatus of claim 27, wherein said nucleic acid-based nanowires are assembled from a nucleic acid selected from the group of nucleic acids consisting of DNA, RNA, threose nucleic acid (TNA), peptide nucleic acid (PNA) Glycol nucleic acid (GNA), locked nucleic acid (LNA), bridged nucleic acid (BNA) and phosphorodiamidate morpholino oligomer (PMO).

29. The apparatus of claim 19, wherein nanowires of the first plurality of nanowires are oriented at a right angle to the second plurality of nanowires.

* * * * *